US00RE38980E

(19) United States
(12) Reissued Patent
Thackeray et al.

(10) Patent Number: US RE38,980 E
(45) Date of Reissued Patent: Feb. 14, 2006

(54) PHOTORESIST COMPOSITIONS

(75) Inventors: James W. Thackeray, Braintree, MA (US); James F. Cameron, Cambridge, MA (US); Roger F. Sinta, Woburn, MA (US)

(73) Assignee: Shipley Company, L.L.C., Marlborough, MA (US)

(21) Appl. No.: 10/097,886

(22) Filed: Mar. 14, 2002

Related U.S. Patent Documents

Reissue of:
(64) Patent No.: 6,037,107
Issued: Mar. 14, 2000
Appl. No.: 08/921,985
Filed: Aug. 28, 1997

(51) Int. Cl.
*G03F 7/00* (2006.01)

(52) U.S. Cl. ..... 430/326
(58) Field of Classification Search ..... 430/326
See application file for complete search history.

(56) References Cited

U.S. PATENT DOCUMENTS

| | | | | |
|---|---|---|---|---|
| 5,258,257 A | * | 11/1993 | Sinta et al. | 430/313 |
| 5,558,971 A | | 9/1996 | Urano et al. | 430/170 |
| 5,580,694 A | | 12/1996 | Allen et al. | 430/326 |
| 5,609,989 A | | 3/1997 | Bantu et al. | 430/270.1 |
| 5,733,704 A | * | 3/1998 | Choi et al. | 430/270.1 |
| 5,753,412 A | | 5/1998 | Babich et al. | 430/270.1 |
| 5,861,231 A | | 1/1999 | Barclay et al. | 430/270.1 |

FOREIGN PATENT DOCUMENTS

| | | |
|---|---|---|
| EP | 0 596 668 A3 | 5/1994 |
| EP | 0 596 668 A2 | 5/1994 |
| EP | 0 631 188 A1 | 12/1994 |
| EP | 0 652 485 A1 | 5/1995 |
| EP | 0 631 188 B1 | 9/1997 |
| WO | WO 94/10608 | 5/1994 |

OTHER PUBLICATIONS

Wallraff et al., "Kinetics of Chemically Amplified Resists", Proceedings 10$^{th}$ International Technical Conference Photopolymer, Oct. 31–Nov. 2, 1994, Sponsored by Society of Plastics Engineers, Inc.

Wallraff et al., "Thermal and Acid Catalyzed Deprotection Kinetics in Candidate Deep Ultraviolet Resist Materials", J. Vac. Sci. Technol. B 1994 12 (6) 3857–3861.

Yano et al, Chem. Abstract 123:354463 "Environmentally Stable Chemically Amplified Resist Effects of Organic Salt Additives", Fujitsu Laboratories, Ltd. Abstract of Proc. SPIE—Int. Soc. Opt. Eng (1995), 2438, pp. 551–563, chemical Abstracts, ACS, 1998.

* cited by examiner

*Primary Examiner*—Cynthia Hamilton
(74) *Attorney, Agent, or Firm*—John J. Piskorski

(57) ABSTRACT

The invention provides photoresist compositions comprising a resin binder having acid labile blocking groups requiring an activation energy in excess of 20 Kcal/mol. for deblocking, a photoacid generator capable of generating a halogenated sulfonic acid upon photolysis and optionally, a base additive. It has been found that linewidth variation is substantially reduced when using the halogenated sulfonic acid generator in a process involving a high temperature post exposure bake.

17 Claims, No Drawings

PHOTORESIST COMPOSITIONS

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to photoresist compositions particularly suitable for DUV exposure. The resists are capable of forming uniform features of submicron dimension across the full width of a semiconductor wafer. More particularly, the invention provides a photoresist film where linewidth variation as a function of high temperature post exposure bake is minimized.

2. Background

Photoresists are photosensitive films for transfer of an image to a substrate. These resists form negative or positive images. After coating a photoresist coating composition onto a substrate, the coating is exposed through a patterned photomask to a source of activating energy such as ultraviolet light to form a latent image in the coating. The photomask has areas both opaque and transparent to activating radiation that define a desired image to be transferred to the underlying substrate. A relief image is provided by development of the latent image pattern in the resist coating.

The use of photoresists is generally described, for example, by DeForest, Photoresist Materials and Processes, McGraw Hill Book Company, New York (1975), and by Moreau, Semiconductor Lithography, Principals, Practices and Materials, Plenum Press, New York (1988).

Recent developments in photoresist imaging involve formulation of photoresists imaged by exposure of coatings to deep ultraviolet (DUV) radiation. As is known by those in the art, DUV refers to exposure radiation having a wavelength in the range of about 350 nm or less, more typically in the range of about 300 nm or less and most often, 248 nm. Photoresists imaged by DUV exposure offer the advantage of providing patterns of reduced feature size compared to photoresists imaged by exposure to radiation of longer wavelength.

"Chemically amplified" photoresist compositions have been developed that are especially suitable for DUV imaging. Chemically amplified photoresists may be negative or positive-acting and rely on many crosslinking events (in the case of a negative-acting resist) or deprotection reactions (in the case of a positive-acting resist), each catalyzed by photogenerated acid or base. In the case of the positive chemically amplified resist, certain cationic photoinitiators capable of yielding a photogenerated acid have been used to induce cleavage of certain "blocking" groups pendant from a photoresist binder, or cleavage of certain groups that comprise a certain photoresist binder backbone. See, for example, U.S. Pat. Nos. 4,491,628; 4,810,613; 4,883,740; 4,968,581; 5,075,199; 5,258,257; 5,362,600; 5,492,273; 5,558,971 and Canadian Patent Application No. 2,001,384, each incorporated herein by reference for its disclosure of DUV positive working chemically amplified photoresist formulations and blocking groups. Upon exposure of a photoresist coating and a post exposure bake, selected cleavage of the blocking group results in formation of a polar functional group, e.g., hydroxyl, carboxyl or imide. The generation of a polar functional group provides differential solubility characteristics between exposed and unexposed areas of the resist coating.

The above patents illustrate a variety of blocking groups that may be utilized for positive working chemically amplified photoresists. Each blocking group requires a given quantity of energy to effect deblocking. The required energy is known in the art as the activation energy. A means to determine activation energy is described by Wallraff et al., Kinetics of Chemically Amplified Resists, Photopolymers Principles, Processes, and Materials, Tenth International Technical Conference, pp. 11–17, Oct. 31–Nov. 2, 1994, Society of Plastic Engineers, Inc. and by Wallraff et al., J. Vac. Sci Technol., 1995, 12 (6) 3857. Activation energy is expressed in units of Kcal/mol. Blocking groups having greater activation energy for deblocking require more severe conditions to effect deblocking. Means for overcoming greater activation energy include use of a stronger photogenerated acid and/or higher bake temperatures.

Many different blocking groups are disclosed in the above identified patents. For example, in U.S. Pat. No. 5,558,971, the blocking group is an acetal or ketal group of the formula "$—OCR^1R^2OR^3$" where $R^1$ and $R^2$ are independently a hydrogen atom, a straight-chain, branched or cyclic alkyl group having 1–6 carbon atoms, a straight-chain or branched haloalkyl group having 1–6 carbon atoms, or a phenyl group, provided that $R^1$ and $R^2$ are not hydrogen at the same time, or $R^1$ and $R^2$ may combine to form a methylene chain having 2–5 carbon atoms, and $R^3$ is a straight chain, branched or cyclic alkyl group having 1–10 carbon atoms, a straight-chain, branched or cyclic haloalkyl group having 1–6 carbon atoms, an acetyl group or an aralkyl group.

The acetal or ketal group as represented by the above formula is deblocked at a relatively low activation energy, typically from about 10 to 20 Kcal/mol. To effect deblocking, a relatively weak photogenerated acid and/or a relatively low temperature post exposure bake or both may be used to effect the deblocking reaction. Though this is desirable for processing of the photoresist coating, a low activation energy formulation suffers certain disadvantages. For example, deblocking of the blocking group may randomly occur during storage of the photoresist in its container. A decreased number of blocking groups on the polymer backbone would likely result in an unpredictable change in resist photospeed upon imaging.

To avoid storage instability, certain vendors of chemically amplified resists have used blocking groups that require a greater activation energy. For example, in U.S. Pat. No. 5,362,600, the blocking group conforms to the formula $—CR^4R^5C(=O)OR^6$ where each of $R^4$ and $R^5$ is independently selected from the hydrogen, an electron withdrawing group such as halogen, lower alkyl having 1 to about 10 carbon atoms, and substituted lower alkyl having 1 to about 10 carbon atoms; and $R^6$ is a substituted or unsubstituted lower alkyl having from 1 to about 10 carbon atoms, substituted or unsubstituted aryl having from 1 to about 10 carbon atoms, and substituted or unsubstituted benzyl having 7 to about 10 carbon atoms. The substituents can be, for example, one or more of halogen, lower alkyl, lower alkoxy, aryl or benzyl. $R^4$ and $R^5$ desirably are each hydrogen. If $R^4$ and/or $R^5$ are halogen or other electron-withdrawing group, upon acidic cleavage of the acetate group, a highly polar group is formed providing enhanced solubility differential between exposed and unexposed regions of the photoresist coating. The difluoro group (i.e., $R^4$ and $R^5$ are both fluoro) is especially suitable and provides extremely high dissolution differential between exposed and unexposed regions with only modest levels of substitution of hydroxy groups on the polymer binder.

For the high energy blocking groups described above, an activation energy of at least 20 Kcal/mole is required and typically, the required activation energy is within the range of from 25 to 40 Kcal/mole. To enable deblocking to occur, it is necessary to use one or both of a photoacid generator capable of liberating a strong acid and/or a high temperature post exposure bake, typically a temperature in excess of 120° C. and preferably, a temperature of from about 130° C. to 150° C. or higher.

For reasons set forth above, those photoresists using blocking groups requiring high activation energy are generally subjected to one and often two high temperature baking steps. In practice, it has been found that with high temperature baking, minor variations in the bake temperature, i.e., variations of ±1° C., across the width of the photoresist coating can lead to significant variation in linewidth across the developed coating and that this variation increases with increased bake temperature. This sensitivity is referred to in the art as PEB sensitivity which is defined as changes in linewidth at a fixed exposure dose on wafers that are post-exposure baked at increasing temperatures. The measured linewidth on each wafer is plotted against the PEB temperature and the PEB sensitivity in nm/° C. is the slope of the line. PEB sensitivity may be as much as 5% per degree Celsius. It is known that it is difficult to maintain a uniform temperature across the full width of the resist coating—i.e., across the full width of a wafer coated with photoresist which may be 8 or more inches in diameter.

Linewidth variation is unacceptable for most commercial applications. Therefore, it would be desirable to have chemically amplified photoresist compositions capable of providing highly resolved fine line images, including images of submicron and sub half-micron dimensions, which are PEB insensitive. It would be particularly desirable to have such a chemically amplified photoresist where variation in linewidth as a function of post exposure bake temperature is reduced or eliminated.

SUMMARY OF THE INVENTION

The present invention provides a chemically amplified photoresist composition comprising a resin binder having acid labile blocking groups requiring an activation energy in excess of 20 Kcal/mole, a photoacid generator capable of generating a strong halogenated sulfonic acid upon photolysis, and optionally a base additive. It has been found that PEB sensitivity as a consequence of a high temperature bake is substantially reduced when using the halogenated sulfonic acid generator and further, the base additive also contributes to a reduction in the PEB sensitivity. Accordingly, the photoresists of the invention provide photoresist coating composition capable of forming highly resolved relief images of submicron dimension with vertical or essentially vertical sidewalls, uniformly imaged across the full width of a wafer over which the photoresist is coated, regardless of the temperature differential across the surface of the resist coating during the bake step.

The photoacid generator used in the formulation of the invention is one that yields a strong halogenated sulfonic acid upon photolysis, preferably one having a $pK_a$ no greater than 0, and more preferably, a $pK_a$ of between −5.0 and −15.0. Preferred photoactive generators are sulfonate salts of compounds containing a strong halogen electron withdrawing group such as the fluorine atom. Suitable bases optionally used in combination with the acid generator are those preferably having a $pK_a$ of at least 9.0 and more preferably, a $pK_a$ between 11.0 and 15.0. Desirably, the strong base is a quaternary ammonium hydroxide.

The invention also provides methods for forming relief images using the photoresists of the invention and articles of manufacture comprising substrates such as a microelectronic wafer or a flat panel display substrate coated with the photoresists invention. Other aspects of the invention are disclosed infra.

DETAILED DESCRIPTION OF THE INVENTION

The photoresists of the invention comprise a resin binder, a photoacid generator that liberates a halogenated sulfonic acid upon photolysis and optionally, a base. The photoresist is used in a process comprising the steps of coating the same onto a substrate, imaging to DUV irradiation and post exposure baking the resist coating at a temperature in excess of 120° C. and preferably in excess of 130° C.

The resin binder component of the photoresist desirably contains phenol units substituted with acid labile groups which may be pendant from the resin backbone. The resin is used in an amount sufficient to render an exposed coating of the resist developable such as with an aqueous alkaline solution. Exemplary phenolic resins containing acid labile groups are disclosed in the above mentioned patents such as U.S. Pat. No. 4,491,628 Ito as well as in U.S. Pat. No. 5,258,257 to Sinta et al, and U.S. Pat. No. 5,492,793 to Ito, each incorporated herein by reference.

Typical resin binders comprise polymers such as novolak resins and polyvinylphenol resins. A preferred polymer suitable for purposes of the invention comprises units of a structure selected from the group consisting of

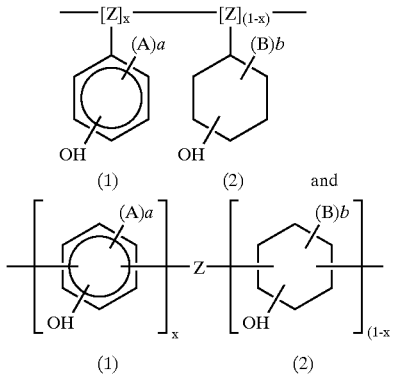

where unit (1) represents a phenolic unit and unit (2) represents a cyclic alcohol unit; Z is an alkylene bridge having from 1 to 3 carbon atoms; A is a substituent on the aromatic ring replacing hydrogen such as lower alkyl having from 1 to 3 carbon atoms, halo such as fluoro, chloro or bromo, alkoxy having from 1 to 3 carbon atoms, hydroxyl, nitro, amino, etc.; B is a substituent such as hydrogen, lower alkyl having from 1 to 3 carbon atoms, halo such as fluoro, chloro or bromo, alkoxy having from 1 to 3 carbon atoms, hydroxyl, nitro, amino, etc., provided that at least 3 of said B substituents are hydrogen; a is a number varying from 0 to 3; b is an integer varying between 6 and 10; and x is the mole fraction of units (1) in the polymer. The percentage of cyclic alcohol units preferably is not so high as to prevent development of an exposed film in a polar developer. The polymer therefore should have a major portion of phenolic units and a minor portion of cyclic alcohol units, i.e., less than about 50 mole percent of cyclic alcohol units. However, it has been found that the transparency of said photoresist composition increases with increasing concentration of cyclic alcohol units and for this reason, in certain cases, it may be desirable to employ a polymer having a major portion of cyclic alcohol units and a minor portion of phenolic units. This can he achieved by using suitable blocking groups which upon acid catalyzed hydrolysis provide polar functional groups rendering exposed regions highly soluble in polar developer solutions.

An additional suitable class of resins comprises a copolymer of hydroxystyrene and an acrylate, methacrylate or a mixture of the two. The hydroxystyrene component provides base solubility to the resist composition. This component is suitably the para- or meta- isomer and can be substituted with various substituents that do not interfere with lithography such as halogen, methoxy or lower alkyl, e.g. methyl or ethyl. α-Methyl-hydroxy-styrene monomer can also be incorporated into the polymer. The ester group of the acrylate or the methacrylate is an acid labile group which inhibits the dissolution of the polymer in alkaline developer and provides acid sensitivity to the polymer. Polymers of this description may be represented by the following structural formula:

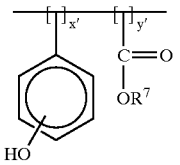

where x' represents the mole fraction of the hydroxystyrene units and y' represents the mole fraction of the acrylate units, the hydroxyl group on the hydroxystyrene may be present at either the ortho, meta or para positions throughout the copolymer, and $R^7$ is substituted or unsubstituted alkyl having 1 to about 18 carbon atoms, more typically 1 to about 8 carbon atoms. Tert-butyl is a generally preferred $R^7$ group. An $R^7$ group is desirably substituted by e.g. one or more halogen atoms (particularly F, Cl or Br), $C_{1-8}$ alkoxy, $C_{2-8}$ alkenyl, etc. The units x' and y' may be regularly alternating in the copolymer, or may be randomly interspersed through the polymer. Preferably, x' varies between 0.5 and 0.95 and y' varies between 0.05 and 0.5.

A preferred class of resins within the above generic formula may be represented as follows:

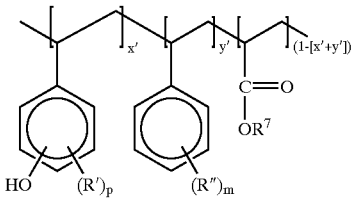

where x', y', and $R^7$ are as defined above and R' and R" are independently halogen, substituted or unsubstituted alkyl having from 1 to 8 carbon atoms, substituted or unsubstituted alkoxy having 1 to 8 carbon atoms, substituted or unsubstituted alkenyl having 2 to 8 carbon atoms, substituted or unsubstituted alkylthio having 1 to 8 carbon atoms, cyano, nitro, etc., and m and p are individually 0 to 5. Polymers conforming to the above formula are disclosed in [copending U.S. patent application Ser. No. 08/665,002 filed Jun. 11, 1996] *U.S. Pat. No. 5,861,231* and incorporated herein by reference.

*A particularly preferred copolymer of the invention corresponds to the following Formula 1:*

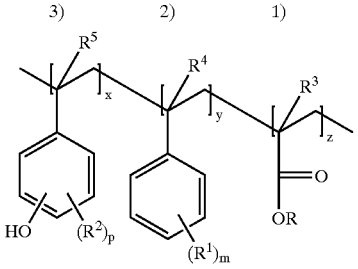

*wherein R of units 1) is substituted or unsubstituted alkyl preferably having 1 to about 10 carbon atoms, more typically 1 to about 6 carbons. Branched alkyl such as tert-butyl are generally preferred R groups. Also, the polymer may comprise a mixture of different R groups, e.g., by using a variety of acrylate monomers during the polymer synthesis.*

*$R^1$ groups of units 2) of Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkylthio preferably having 1 to about 8 carbons, cyano, nitro, etc.; and m is an integer of from 0 (where the phenyl ring is fully hydrogen-substituted) to 5. As with units 1), the polymer may comprise a mixture of different units 2) with differing $R^1$ groups or no $R^1$ groups (i.e. m=0) by using a variety of substituted or unsubstituted vinylphenyl monomers during the polymer synthesis.*

*$R^2$ groups of units 3) of Formula I each independently may be e.g. halogen (particularly F, Cl and Br), substituted or unsubstituted alkyl preferably having 1 to about 8 carbons, substituted or unsubstituted alkoxy preferably having 1 to about 8 carbon atoms, substituted or unsubstituted alkenyl preferably having 2 to about 8 carbon atoms, substituted or unsubstituted alkylthio preferably having 1 to about 8 carbons, cyano, nitro, etc.; and p is an integer of from 0 (where the phenyl ring has a single hydroxy substituent) to 5. As with units 1), the polymer may comprise a mixture of different units 3) with differing $R^2$ groups or no $R^2$ groups (i.e. p=0) by using a variety of substituted or unsubstituted vinylphenyl monomers during the polymer synthesis. As shown in Formula I above, the hydroxyl group of units 3) may be either at the ortho, meta or para positions throughout the copolymer. Para or meta substitution is generally preferred.*

*Each $R^3$, $R^4$ and $R^5$ substituents are hydrogen.*

*In the above Formula I, x, y and z are the mole fractions or percents of units 3), 2) and 1) respectively in the copolymer. These mole fractions may suitably vary over rather wide values, e.g., x may be suitably from about 10 to 90 percent, more preferably about 20 to 90 percent; y may be suitably from about 1 to 75 percent, more preferably about 2 to 60 percent; and z may be 1 to 75 percent, more preferably about 2 to 60 percent.*

*Copolymers include those where the only polymer units correspond to the general structures of units 1), 2) and 3) above and the sum of the mole percents x, y and z equals one hundred.*

The above described polymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e., $R^7$—O—C(=O)—, moiety of the acrylate units serves as the acid labile groups of the resin and will undergo photoacid induced cleavage upon exposure of a coating of a photoresist coating the resin to DUV irradiation. Preferably the copolymer will have a $M_w$ of from about 2,000 to about 50,000, more preferably about 5,000 to about 30,000 with a molecular weight distribution of about 3 or less, more preferably a molecular weight distribution of about 2 or less. Desirably, the terpolymer contains the hydroxystyrene in the range of 50 to 90 mol % depending on the desired dissolution rate/sensitivity. The terpolymer has a high glass transition temperature of about 130° C. to about 170° C. The terpolymer also has a high acid sensitivity. The acid labile ester groups of the terpolymer are surprisingly thermally stable in the presence of the phenolic hydroxy groups up to a temperature of about 180° C. This enables high temperature pre- and post exposure baking of a film of the composition which results in substantially improved lithographic performance. Additional details relating to the formation of such polymers can be found in U.S. Pat. No. 5,492,793 and in the above cited copending patent application.

In addition to the resins described above, non-phenolic resins, e.g. a copolymer of an alkyl acrylate such as t-butylacrylate or t-butylmethacrylate and a vinyl alicyclic monomer such as a vinyl norbornyl or vinyl cyclohexanol compound may be prepared by such free radical polymerization or other known procedures and used as a binder in the photoresists described herein.

At least a portion of the available hydroxyl groups on any of the above described polymer binders are bonded to an acid labile blocking group. In accordance with the invention, suitable blocking groups are those that deblock at an activation energy of at least 20 Kcal/mole and which, upon photocleavage, provide a group that is at least as polar as hydroxyl.

Using vinylic polymers for purposes of illustration, the acid labile blocking groups are generally used in accordance with the following scheme in which a preferred polymer binder is condensed with a compound that comprises an acid labile group R and a suitable leaving group (L).

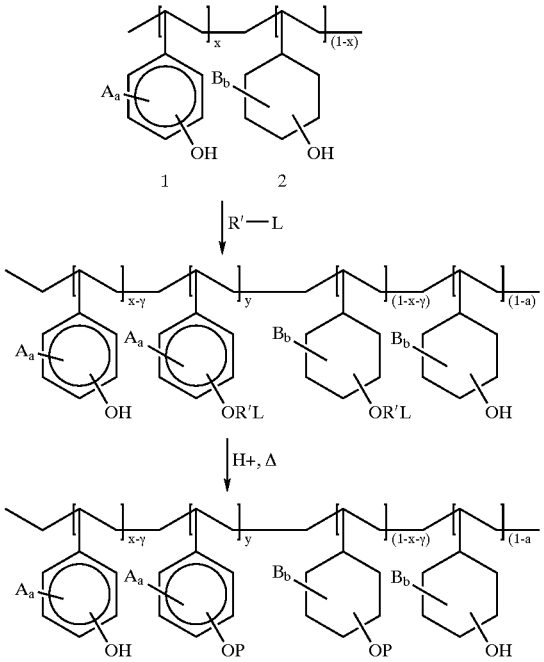

In the scheme shown described above, unit (1) represents a phenolic unit and unit (2) represents, a cyclic alcohol unit: A, B, a, b and x are as defined above, R' is an acid labile blocking group; P is a polar group formed by acidic cleavage of the acid labile blocking group R; and y is the mole fraction of units substituted with an acid labile group. The mole fraction represented by y may differ between aromatic units and cyclic alcohol units. Upon exposure, the photogenerated acid cleaves the acid labile group which is converted from a dissolution inhibiting group to a base soluble organic group thereby enabling image development of the composition.

Regardless of the resin used as the photoresist binder, it is substituted with an acid labile group that yields a suitable leaving group at an activation energy of 20 Kcal/mol or greater. For example, to provide acid labile acetic acid groups pendant to the resin binder backbone, the preformed resin binder may be condensed with a compound of the formula $L—CR^8R^9C(=O)—OR^{10}$, where L is a leaving group such as bromide or chloride as described above, $R^8$ and $R^9$ are each independently hydrogen, an electron withdrawing group such as halogen (particularly F, Cl or Br), or substituted or unsubstituted $C_{1-10}$ alkyl; and $R^{10}$ is substituted or unsubstituted $C_{1-10}$ alkyl, or substituted or unsubstituted aryl such as phenyl or aralkyl such as benzyl. The condensation provides the $—CR^8R^9C(=O)—O—R^{10}$ groups pendant to the resin binder backbone and grafted onto the resin's available hydroxyl groups. Photoacid degradation radation of these groups during exposure and/or post-exposure heating provides the polar acetic acid ether moiety pendant to the resin binder backbone. Other acid labile groups may also be employed, e.g. oxycarbonyl groups such as those of the formula $—C(=O)OR^6$ where $R^6$ is as defined above and preferably is t-butyl or benzyl. See U.S. Pat. No. 5,258,257 to Sinta et al. incorporated herein by reference for a discussion of acid labile groups and preparation and use of resist resin binders comprising acid labile groups.

The photoresist compositions of the invention also contain a photoacid generator capable of generating a strong acid upon exposure to deep UV radiation. The photoacid generator is one that liberates a sulfonic acid having a strong electron withdrawing group. The function of the electron withdrawing group is to increase the strength of the photogenerated acid. The sulfonic acid has a $pK_a$ of 0 or less and preferably a $pK_a$ within a range of −5 to −15 or less. The photoacid generator is suitably employed in an amount sufficient to generate a latent image in a coating layer of the resist upon exposure to activating radiation.

In accordance with the invention, the photoacid generator is one capable of generating an acid of the formula:

$$X_aRSO_3H$$

where $X_aR$ is an organic radical substituted with strong electron withdrawing groups X. R may be alkyl having from 1 to 18 carbon atoms, aryl such as phenyl, benzyl, naphthyl, etc. Strong electron withdrawing groups that may be substituted onto R are exemplified by halo, nitro, cyano, etc., preferably fluoro. The letter a represents the number of strong electron withdrawing groups substituted onto R and is a whole number preferably equal to 1 to 18. Preferred strong acids conforming to the above formula are perfluorooctane sulfonic acid and 2-trifluoromethylbenzene sulfonic acid. Representative examples of compounds capable of generating acids conforming to the above generalized formula are given below where nomenclature and substituent identification used in the text is derived from an identified reference source and where, from time to time, the $(X_aRSO3)^-$ radical is substituted onto the exemplified material.

One class of suitable photoacid generators is disclosed in U.S. Pat. No. 5,558,976. Representative examples of these photoacid generators include:

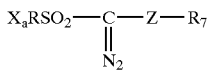

where $R^7$ is a straight-chain, branched or cyclic alkyl group having from 1 to 10 carbon atoms and Z is a sulfonyl group or a carbonyl group:

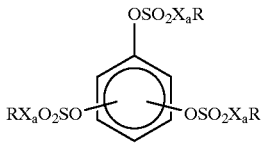

where R is as defined above; and

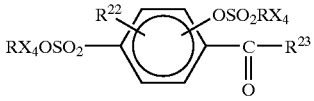

where $R^{22}$ is hydrogen, hydroxyl or a group represented by the formula $X_aRSO_2O$— where $X_aR$ is as defined above, and $R^{23}$ is a straight or branched alkyl group having from 1 to 5 carbon atoms or a group represented by the formula:

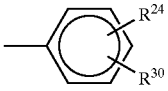

where $R^{24}$ and $R^{30}$ are independently a hydrogen atom, a halogen atom, a straight chain or branched alkyl group having 1–5 carbon atoms, a straight chain or branched alkoxy group having 1–5 carbon atoms, or a group of the formula:

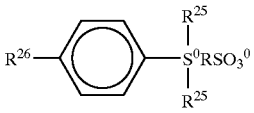

where $R^{25}$ is a straight chain or branched alkyl group having 1–4 carbon atoms, a phenyl group, a substituted phenyl group or an aralkyl group; $R^{26}$ is a hydrogen atom, a halogen atom or a straight-chain, branched or cyclic alkyl group having 1–6 carbon atoms; $R^{27}$ is a straight chain or branched perfluoroalkyl group having 1–8 carbon atoms, a straight chain, branched or cyclic alkyl group having 1–8 carbon atoms, a 1-naphthyl group, a 2-naphthyl group, a 10-camphor group, a phenyl group, a tolyl group, a 2,5-dichlorophenyl group, a 1,3,4-trichlorophenyl group or a trifluoromethylphenyl group.

Nitrobenzyl based compounds are disclosed in EPO published application No. EP 0 717 319 A1 incorporated herein by reference. Such compounds may be defined by the following general formula:

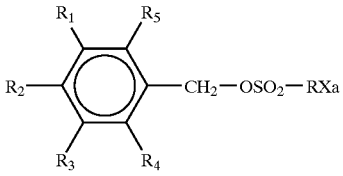

where each $R_1$, $R_2$ and $R_3$ are individually selected from the group consisting of hydrogen and lower alkyl group having from 1–4 carbon atoms; and $R_4$ and $R_5$ are individually selected from the group consisting of $CF_3$ and $NO_2$ with the proviso that $R_4$ and $R_5$ cannot both be $CF_3$; and $RX_a$ is as defined above.

N-sulfonyloxyimide PAGs may also be used in the compositions of the invention and are as disclosed in World application WO94/10608 incorporated herein by reference. These materials conform to the formula:

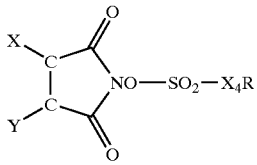

where the carbon atoms form a two carbon structure having a single, double or aromatic bond, or, alternatively, wherein they form a three carbon structure, that is, where the inside ring is a five member or six member ring; X and Y (1) form a cyclic or polycyclic ring which may contain one or more hetero atoms, or (2) form a fused aromatic ring, or (3) may be independently hydrogen, alkyl or aryl, or (4) may be attached to another sulfonyloxyimide containing residue, or (5) may be attached to a polymer chain or backbone, or alternatively, form

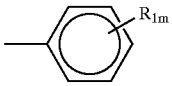

where $R_1$ is selected from the group consisting of H, acetyl, acetamido, alkyl having 1 to 4 carbons where m=1 to 3, $NO_2$ where m=1 to 2, F where m=1 to 5, Cl where m=1 to 2, $CF_3$ where m=1 to 2, and $OCH_3$ where m=1 to 2, and where m may otherwise be from 1 to 5, and combinations thereof, and where X and Y (1) form a cyclic or polycyclic ring which may contain one or more hetero atoms, (2) form a fused aromatic ring, (3) may be independently H, alkyl or aryl, (4) may be attached to another sulfonyloxyimide containing residue, or (5) may be attached to a polymeric chain or backbone.

Iodonium salt photoacid generators are disclosed in published European application 0 708 368 A1 and represent another preferred acid generator. Such salts are represented by the following formula:

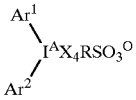

where $Ar^1$ and $Ar^2$ each independently represents a substituted or unsubstituted aryl group. A preferred example of the aryl group includes a $C_{6-14}$ monocyclic or a condensed ring aryl group. Preferred examples of the substituent on the aryl group include an alkyl group, a haloalkyl group, a cycloalkyl group, an aryl group, an alkoxy group, a nitro group, a carboxyl group, an alkoxycarbonyl group, a hydroxyl group, mercapto group, and a halogen atom. Sulfonium salts represent the most preferred embodiment of the invention and are represented by the following formula:

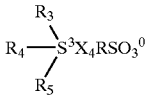

$R^3$, $R^4$ and $R^5$ each independently represents a substituted or unsubstituted alkyl group or aryl group. With regard to each of the above formulae, preferred examples of the substituted or unsubstituted alkyl group and aryl group include a $C_{6-14}$ aryl group, a $C_{1-5}$ alkyl group, and substituted derivatives thereof. Preferred examples of the substituent on the alkyl group include a $C_{1-8}$ alkoxy group, a $C_{1-8}$ alkyl group, nitro group, carboxyl group, hydroxyl group, and a halogen atom. Preferred examples of the substituent on the aryl group include a $C_{1-8}$ alkoxy group, carboxyl group, an alkoxycarbonyl group, a $C_{1-8}$ haloalkyl group, a $C_{5-8}$ cycloalkyl group and a $C_{1-8}$ alkylthio group. Two of $R^3$, $R^4$ and $R^5$ and $Ar^1$ and $Ar^2$ may be connected to each other via its single bond or a substituent.

Disulfone derivatives are also suitable for the formulations of this invention and are disclosed in published European application 0 708 368 A1. Such materials may be represented by the following formulae:

$$Ar^3—SO_2—SO_2—RX_a$$

wherein $RX_a$ is as defined above and $Ar^3$ represents a substituted or unsubstituted aryl group. A preferred example of the aryl group includes a $C_{6-14}$ monocyclic or condensed-ring aryl group. Preferred examples of the substituent on the aryl group include an alkyl group, a haloalkyl group, a cycloalkyl group, an aryl group, an alkoxy group, nitro group, carboxyl group, an alkoxycarbonyl group, hydroxyl group, mercapto group, and halogen.

Of the photoacid generators contemplated for use in the photoresists of the invention, most preferred are di-(4-t-butylphenyl)iodonium perfluorooctane sulfonate and di-(4-t-butylphenyl) iodonium 2-trifluoromethyl benzene sulfonate.

The photoresist composition of the invention preferably contains a strong base having a $pK_a$ of at least 9 and preferably a $pK_a$ within the range of from 11 to 15. A preferred base for the photoresist of the invention would conform to the formula $N(R')_4A$ where each R' is independently substituted or unsubstituted alkyl preferably having from 1 to about 12 carbon atoms, more typically 1 to about 8 carbon atoms, or a substituted or unsubstituted aryl such as a $C_{6-10}$ aryl, e.g. phenyl, naphthyl and the like. A is a counter anion of a halide, a substituted or unsubstituted hydroxyalkanoyl preferably having 1 to about 18 carbon atoms (i.e. a group substituted by hydroxy and carbonyl such as lactate $—CH_3CH(OH)C(=O)O^-$), substituted or unsubstituted sulfonate including a $C_{6-18}$ aryl or $C_{1-12}$ alkyl sulfonate. The term hydroxyalkanoyl as used herein refers to an alkanoyl group having one or more hydroxy moieties (typically 1, 2, 3 or 4 hydroxy moieties) on one or more carbons of the alkanoyl group. Exemplary sulfonate A groups include mesylate, triflate, tosylate, etc. Substituted A groups may be suitably substituted by one or more groups such as halo particularly fluoro, chloro and bromo, hydroxide, cyano, nitro, $C_{1-12}$ alkyl, $C_{2-12}$ alkyl, $C_{2-12}$ alkenyl, $C_{1-12}$ alkoxy, $C_{1-12}$ alkanoyl including acyl, etc. Additional amines can be found in U.S. Pat. No. 5,498,506 and SPIE, 2438, 551, 1995 and SPIE 2438, 563, 1995. Examples of suitable amines include ammonium sulfonate salts such as piperidinium p-toluenesulfonate and dicylohexylammonium p-tolunesulfonate; alkyl amines such as tripropylamine and dodecylamine; aryl amines such as diphenylamine, triphenylamine, aminophenol, 2-(4-aminophenyl)-2-(4-hyroxyphenyl) propane, etc.

The base can be added to the photoresist composition in a relatively small amount, for example, from about 0.01 to 5 percent by weight of the polymer and more preferably, from 0.05 to 1 percent by weight.

An optional component of the photoresist composition of the invention is a dye. Preferred dyes enhance resolution of the patterned resist image, typically by reducing reflections and the effects thereof (e.g. notching) caused by the exposure radiation. Preferred dyes include substituted and unsubstituted phenothiazine, phenoxazine, anthracene and anthrarobin compounds. Preferred substituents of substituted phenothiazine, phenoxazine, anthracene and anthrarobin include e.g. halogen, $C_{1-12}$ alkyl, $C_{1-12}$ alkoxy, $C_{2-12}$ alkenyl, $C_{1-12}$ alkanoyl such as acetyl, aryl such as phenyl, etc. Copolymers of such compounds also may be used as a dye, e.g., an anthracene acrylate polymer or copolymer. A curcumin dye also may be used for some applications. In addition to reducing reflections in deep U.V. exposures, use of a dye may expand the spectral response of the compositions of invention.

Photoresists of the invention also may contain other optional materials. For example, other optional additives include anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, a glycol ether exemplified by 2-methoxyethyl ether (diglyme), ethylene glycol monomethyl ether, propylene glycol monomethyl ether; a Cellosolve ester such as Cellosolve acetate, propylene glycol-monomethyl ether, methyl ethyl ketone, ethyl lactate, etc. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as a semiconductor by spinning, dipping, roller coating, slot coating or other conventional coating technique. When spin coating, the solids content of the coating solution may be adjusted to provide a desired film thickness based upon the specific spinning equipment utilized, the viscosity of the solution, the speed of the spinner and the amount of time allowed for spinning.

The resist compositions of the invention are applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system—i.e., generate sufficient acid to produce a patterned image in the resist coating layer following post exposure bake, and more specifically, the exposure energy typically ranges from about 1 to 300 mJ/cm$^2$, dependent upon the exposure tool and the components of the photoresist composition.

Coating layers of the resist composition of the invention are preferably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Following exposure, the film layer of the composition is preferably baked at temperatures ranging from about 120° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

The following examples illustrate the invention.

SYNTHESIS EXAMPLES

Example 1

Preparation of Di-(4-t-butylphenyl)iodonium 2-trifluoromethylbenzenesulfonate Part A: Preparation of 2-Trifluoromethylbenzenesulfonic acid A 1L 3 neck flask was charged with 2-trifluoromethylbenzenesulfonyl chloride (134.55 g, 0.55 mol) and water (320 mL). The reaction flask was fitted with a condenser, an overhead stirrer and a nitrogen bubbler and the biphasic reaction mixture heated at reflux for 24 h. During this time, the sulfonyl chloride hydrolyzed to 2-trifluoromethylbenzenesulfonic acid, giving a clear homogeneous solution. The aqueous solution was concentrated under vacuum and the solid residue further dried in vacuum at 40° C. for 24 h to give 2-Trifluoromethylbenzenesulfonic acid as an off white solid.

Part B: Preparation of Di-(4-t-butylphenyl)iodonium 2-trifluoromethylbenzenesulfonate A 1L 3 neck round bottom flask equipped was charged t-butylbenzene (134.22 g, 1.00 mol) and acetic anhydride (204.18 g, 2.00 mol). The flask was fitted with an efficient overhead paddle stirrer and the stirrer started while potassium iodate (107.00 g, 0.50 mol) was added to give a white suspension. The reaction vessel was then equipped with a thermometer and a pressure equalizing dropping funnel (125 mL) fitted with a $N_2$ bubbler.

The reaction mixture was cooled to 0–5° C. in a large ice-water bath and concentrated sulfuric acid (107.89 g, 1.10 mol) added dropwise via the addition funnel. The addition was carried out at such a rate as to maintain the reaction temperature in the 20–30° C. range and required around 2 h. As the addition proceeded the starting white suspension became orange-yellow in color and the viscosity of the reaction mixture increased giving a tan paste. Once the addition was over, the reaction mixture was stirred at water bath temperature (20° C.) for a further 22 h. The reaction mixture was cooled to 5–10° C. and water (350 mL) was added dropwise over @ 30 min, maintaining the temperature below 30° C. The first @ 50 mL was added at a particularly slow rate to control the initial exotherm, thereafter the rest of the water was essentially added in one portion.

The resulting cloudy mixture was washed with hexane (3×75 mL) and the aqueous solution of diaryliodonium salt was returned to the reaction flask and cooled to 15–20° C. in an ice water bath. 2-Trifluoromethylbenzenesulfonic acid (113.09 g, 0.50 mol) (prepared as in Part A above) was added in one portion with stirring. The resulting cloudy reaction mixture was neutralized with ammonium hydroxide (14.8N, 311 mL, 4.60 mol). The amount of base used corresponds to the theoretical amount required to neutralize all acidic species in the pot, assuming quantitative reaction. The addition of the base was carried out at such a rate as to keep the temperature below 30° C. and required about 2 h. As the pH of the reaction mixture approached 6–7, a brown gummy solid starts to precipitate from solution. At this point, addition of ammonium hydroxide is temporarily stopped and dichloromethane (300 mL) is added to give a biphasic mixture. After stirring for 3 h, the dichloromethane layer was drained off and the aqueous layer extracted with additional dichloromethane (2×100 mL).

The combined dichloromethane extracts was washed with dilute ammonium hydroxide until the pH of the aqueous layer is in the 7–8 range [1×100 mL, the pH of the aqueous solution was adjusted to 8–9 by adding sufficient ammonium hydroxide (14.8N) in small portions]. The organic layer was washed with water (2×100 mL) until the pH of the aqueous phase was around 6–7. The dichloromethane solution was concentrated on a rotary evaporator under water aspirator vacuum. The resulting residue is then purified by successive recrystallizations from ethyl acetate-cyclohexane. The resulting white solid was dried at 70° C. in vacuum for 36 h, to give di-(4-t-butylphenyl)iodonium 2-trifluoromethylbenzenesulfonate as a white powder.

Example 2

Preparation of Di-(4-t-butylphenyl)iodonium perfluorooctanesulfonate

A 1L 3 neck round bottom flask equipped was charged t-butylbenzene (134.22 g, 1.00 mol) and acetic anhydride (204.18 g, 2.00 mol). The flask was fitted with an efficient overhead paddle stirrer and the stirrer started while potassium iodate (107.00 g, 0.50 mol) was added to give a white suspension. The reaction vessel was then equipped with a thermometer and a pressure equalizing dropping funnel (125 mL) fitted with a $N_2$ bubbler. The reaction mixture was cooled to 0–5° C. in a large ice-water bath and concentrated sulfuric acid (107.89 g, 1.10 mol) added dropwise via the addition funnel.

The addition was carried out at such a rate as to maintain the reaction temperature in the 20–30° C. range and required around 2 h. As the addition proceeded the starting white suspension became orange-yellow in color and the viscosity of the reaction mixture increased giving a tan paste. Once the addition was over, the reaction mixture was stirred at water bath temperature (20° C.) for a further 22 h. The reaction mixture was cooled to 5–10° C. and water (350 mL) was added dropwise over @ 30 min, maintaining the temperature below 30° C. The first @ 300 mL was added at a particularly slow rate to control the initial exotherm, thereafter the rest of the water was essentially added in one portion.

The resulting cloudy mixture was washed with hexane (3×75 mL) and the aqueous solution of diaryliodonium salt was returned to the reaction flask and cooled to 15–20° C. in an ice water bath. Perfluorooctanesulfonic acid, potassium salt (269.11 g, 0.50 mol) was added in one portion with stirring. The resulting cloudy reaction mixture was neutralized with ammonium hydroxide (14.8N, 277 mL, 4.10 mol). The amount of base used corresponds to the theoretical amount required to neutralize all acidic species in the pot, assuming quantitative reaction. The addition of the base was carried out at such a rate as to keep the temperature below 30° C. and required about 2 h. As the pH of the reaction mixture approached 6–7, a brown gummy solid starts to precipitate from solution. At this point, addition of ammonium hydroxide is temporarily stopped and dichloromethane (300 mL) is added to give a biphasic mixture. After stirring for 3 h, the dichloromethane layer was drained off and the aqueous layer extracted with additional dichloromethane (2×100 mL).

The combined dichloromethane extracts was washed with dilute ammonium hydroxide until the pH of the aqueous layer is in the 7–8 range [1×100 mL, the pH of the aqueous solution was adjusted to 8–9 by adding sufficient ammonium hydroxide (14.8N) in small portions]. The organic layer was washed with water (2×100 mL) until the pH of the aqueous phase was round 6–7. The dichloromethane solution was concentrated on a rotary evaporator under water aspirator vacuum. The resulting residue is then purified by successive recrystallizations from ethyl acetate-cyclohexane. The resulting white solid was dried at 70° C. in vacuum for 36 h, to give di-(4-t-butylphenyl)iodonium perfluorooctanesulfonate as a white powder.

Example 3

Preparation of Triphenylsulfonium perfluorooctanesulfonate

To a suspension of perfluorooctanesulfonic acid potassium salt (10.76 g, 20.0 mmol) in water (100 mL) at room temperature under nitrogen was added dropwise triphenylsulfonium bromide (6.87 g, 20.0 mmol) over 15 min. After stirring the suspension for 30 min., dichloromethane (100 mL) was added and the biphasic mixture stirred at room temperature for 20 h. Additional dichloromethane (100 mL) was added and the layers separated. The organic layer was washed with water (3×75 mL) until the washings were neutral (pH 7). After drying ($MgSO_4$), removal of the solvent in vacuum gave a viscous gum which was further dried by heating at 50° C. for 24 h under vacuum. In this way, triphenylsulfonium perfluorooctanesulfonate was isolated as a pale yellow gummy solid.

Example 4

Preparation of Triarylsulfonium perfluorooctanesulfonate

To a suspension of perfluorooctanesulfonic acid potassium salt (24.81 g, 46.1 mmol) in water (150 mL) at room temperature under nitrogen was added dropwise triarylsulfonium chloride (50% aqueous solution, 27.50 g) over 15 min. After stirring the suspension for 30 min., dichloromethane (75 mL) was added and the mixture stirred at room temperature for 20 h. Additional dichloromethane (225 mL) was added and the layers separated. The organic layer was washed with water (3×125 mL) until the washings were neutral (pH 7). After drying ($MgSO_4$), removal of the solvent in vacuum gave a viscous gum which was further dried by heating at 80–90° C. for 84 h under vacuum. In this way, triarylsulfonium perfluorooctanesulfonate was isolated as a glassy solid.

Example 5

Preparation of N-[(perfluorooctanesulfonyl)oxy]-norborane-2,3-dicarboximide

A 500 mL 3 neck flask was charged with N-hydroxy-5-norbornene-2,3-dicarboximide (22.39 g, 0.125 mol). The flask was fitted with a condenser, a dropping funnel, a nitrogen bubbler and a magnetic stirrer.

1,1,1,3,3,3-Hexamethyldisilazane (14.50 mL, 11.10 g, 68.75 mmol) was added via the dropping funnel followed by one drop of chlorotrimethylsilane as catalyst. The suspension was brought to a gentle reflux and heated there at for 3 h. The resulting solution solidified upon cooling to room temperature. This solid was presumed to be the corresponding N-OTMS ether. 1,2-Dimethoxyethane (75 mL) was added followed by perfluorooctanesulfonyl fluoride (37.85 mL, 69.04 g, 0.1375 mol) and the resulting biphasic mixture heated to reflux. A solution of triethylamine (3.48 mL, 2.53 g, 25.0 mmol) in 1,2-dimethoxyethane (25 mL) was added to the hot solution and the mixture turned pale orange. The reaction mixture was heated at reflux for 64 h to give a dark brown-black solution.

At this stage, TLC showed the presence of the desired product and confirmed complete consumption of the starting alcohol. The reaction mixture was transferred to a 500 mL single neck flask and concentrated in vacuum to give a tan semi-solid which solidified on cooling to room temperature. The crude product (82.10 g) was suspended in hot methanol (200 mL) and heated to dissolve the solid. The resulting solution was cooled to room temperature and on standing for 6 h, a significant amount of crystals were deposited.

The crystals were collected by suction filtration, rinsed with ice cold methanol (2×25 mL) and dried in vacuum at room temperature for 18 h to give 28.03 g of material. The mother liquor was reduced to half its original volume and cooled in an ice bath to deposit additional solid. The second crystal crop was isolated as described above to give an additional 6.81 g of material. The two crystal crops were combined and purified by dry flash column chromatography using Flash grade silica gel using 50% dichloromethane/50% hexane as eluant. The material was further purified by recrystallization from hexanes. After drying at 50° C. for 24 h, N-[(perfluorooctanesulfonyl)oxy]-5-norbornene-2,3-dicarboximide was isolated as a white crystalline solid.

FORMULATION EXAMPLES

Example 1

A control resist formulation comprising a terpolymer of 4-hydroxystyrene, styrene and t-butylacrylate (72.35 g of a 20 wt. % solution in ethyl lactate), di-(4-t-butylphenyl) iodonium camphorsulfonate (DTBIOCS) 7.23 g of a 10 wt. % solution in ethyl lactate), a basic additive (2.89 g of 20 wt. % solution in propylene glycol monomethyl ether acetate), copolymer of 9-anthracene methacrylate and 2-hydroxyethyl methacrylate (0.23 g), Silwet™L-7604 (1.60 g of a 5 wt. % solution in ethyl lactate) and ethyl lactate (15.69 g) was prepared.

Examples 2 to 5

Formulation examples 2 to 8 were prepared in a similar fashion to that described above incorporating the formulation indicated in Table II.

RESIST PROCESSING EXAMPLES

Table I details the process conditions for the experiment using the resist formulation of on 1 Example. The wafers were processed on a GCA Microtrak coater and developer equipped for contact bakes. Exposures were performed on a GCAXLS7800 0.53NA, 0.74σ DUV Stepper.

TABLE I

Process Information for Formulation DOE

| Process Variable | Setting |
|---|---|
| Thickness | 6570 Å ($E_{wafers}$) |
| Softbake | 335° C., 60 sec. |
| PEB | 125–145°C. in 5° C. steps |
| Developer | MF-501 (0.24N surf.) |
| Develop Process | 45 sec. Single stream puddle, 16 psi, Puddle Build 4 sec @ 500 rpm + 2 sec @ 50 rpm |

Results

Table II summarizes the PEB sensitivity results over the 130–140° C. for dyed resist formulations. PEB sensitivity is defined as the difference is line width between the smallest and width lines across the resist surface.

TABLE II

PEB Sensitivity Results over 130–140° C. PEB Range

| Example | Formulation | PEB Sensitivity (nm/° C.) |
|---|---|---|
| 1 | Control (5% DTBPIOCS, 4% Polyethyoxylated ethylene diamine | 14.7 |
| 2 | 5% DTBPOICS 0.4% DTBPI Lactate | 11.9 |
| 3 | 5% DTBPOTFMBS, 0.4% TBAH | 4.0 |
| 4 | 5% DTBPIOPFOS, 0.4% TBAH | 4.0 |
| 5 | 5% TPSCSA, 0.4% TBAH | 9.3 |

The invention should not be construed as limited to the above recited examples.

We claim:

[1. A process for formation of an image in a photoresist film, said process comprising:

(a) providing a positive working photoresist composition comprising an alkali soluble resin substituted with an acid labile blocking group that requires an activation energy of at least 20 Kcal/mol for deblocking, and a photoacid generating compound that undergoes photolysis when exposed to a pattern of activating radiation at a wavelength of 350 nm or less to yield a sulfonic acid having a strong electron withdrawing group, and wherein the alkali soluble resin conforms to the formula:

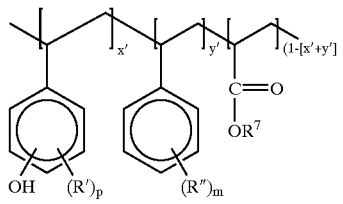

where x' is greater than zero and represents the mole fraction of the hydroxystyrene units and y' is greater than zero and represents the mole fraction of the acrylate units, the hydroxyl group on the hydroxystyrene may be present at either the ortho, meta or para positions throughout the copolymer, $R^7$ is substituted or unsubstituted alkyl having 1 to about 18 carbon atoms, R' and R" are independently halogen, substituted or unsubstituted alkyl having from 1 to about 8 carbon atoms, substituted or unsubstituted alkoxy having from 1 to about 8 carbon atoms, substituted or unsubstituted alkenyl having from 2 to about 8 carbon atoms, substituted or unsubstituted alkylthio having from 1 to about 8 carbon atoms, cyano or nitro; and m and p are independent 0 to 5;

(b) exposing said photoresist to deep ultraviolet radiation to deblock the acid labile group, baking said exposed photoresist film at a temperature in excess of 120° C., (c) developing said photoresist with an aqueous alkaline solution.]

[2. The process of claim 1 where the bake temperature is in excess of 140° C.]

[3. The process of claim 1 where the photoacid generator is one capable of generating an acid of the formula:

$$X_aRSO_3^-$$

where R is an organic radical having from 1 to 18 carbon atoms, X is a strong electron withdrawing group and a is a whole number equal to 1 or 2.]

[4. The process of claim 3 where the $pK_a$ of the liberated acid does not exceed 0.]

[5. The process of claim 3 where the $pK_a$ varies between −5 and −15.]

[6. The process of claim 3 where the strong electron withdrawing group is selected from the group consisting of halo, nitro, and cyano.]

[7. The process of claim 3 where the strong electron withdrawing group is perfluoroalkyl having from 1 to 18 carbon atoms.]

[8. The process of claim 7 where the strong electron withdrawing group is trifluoromethyl.]

[9. The process of claim 1 where the acid labile blocking group requires an activation energy of from 25 to 40 Kcal/mol for deblocking.]

[10. The process of claim 1 where the acid is selected from the group consisting of perfluorooctane sulfonic acid and 2-trifluoromethylbenzene sulfonic acid.]

[11. The process of claim 1 where the photoresist contains a base having a $pK_a$ of at least 9.]

[12. The process of claim 11 where the $pK_a$ varies between 11 and 15.]

[13. The process of claim 11 where the base conforms to the formula $N(R')_4A$ where R' is substituted or unsubstituted alkyl having from 1 to about 12 carbon atoms or substituted or unsubstituted aryl, A is a counter anion of a member selected from the group consisting of halide, a substituted or unsubstituted hydroxyalkanoyl having from 1 to 18 carbon atoms and substituted or unsubstituted sulfonate.]

[14. The process of claim 13 where the counter anion is sulfonate.]

[15. The process of claim 1 wherein the photoresist is exposed to radiation having a wavelength of about 248 nm.]

*16. A process for formation of an image in a photoresist film, said process comprising:*

*(a) providing a positive working photoresist composition comprising an alkali soluble resin substituted with an acid labile blocking group that requires an activation energy of at least 20 Kcal/mol for deblocking, and a photoacid generating compound that undergoes photolysis when exposed to a pattern of activating radiation at a wavelength of 350 nm or less to yield a sulfonic acid having a strong electron withdrawing group, and wherein the alkali soluble resin conforms to the formula:*

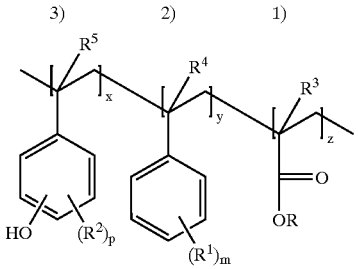

*where x is from about 10 to 90 percent, y is from about 1 to 75 percent, and z is from 1 to 75 percent of the mole fraction, the hydroxyl group on the hydroxystyrene may be present at either the ortho, meta or para positions throughout the copolymer, R is substituted or unsubstituted alkyl having 1 to 10 carbon atoms, $R^1$ and $R^2$ are independently halogen, substituted or unsubstituted alkyl having from 1 to 8 carbon atoms, substituted or unsubstituted alkoxy having from 1 to 8 carbon atoms, substituted or unsubstituted alkenyl having 2 to 8 carbon atoms, substituted or unsubstituted alkylthio having from 1 to 8 carbon atoms, cyano, and nitro; and m is an integer of from 0 to 5 and p is an integer of from 0 to 5; and $R^3$, $R^4$, and $R^5$ are hydrogen;*

*(b) exposing said photoresist to deep ultraviolet radiation to deblock the acid labile group, baking said exposed photoresist film at a temperature in excess of 120° C.; and*

*(c) developing said photoresist with an aqueous alkaline solution.*

*17. The process of claim 16 wherein x is from about 20 to 90 percent of the mole fraction.*

*18. The process of claim 16 wherein y is from about 2 to 60 percent of the mole fraction.*

*19. The process of claim 16 wherein z is from about 2 to 60 percent of the mole fraction.*

*20. The process of claim 16 where the bake temperature is in excess of 140° C.*

*21. The process of claim 16 where the photoacid generator is one capable of generating an acid of the formula:*

$$X_aRSO_3^-$$

*where R is an organic radical having from 1 to 18 carbon atoms, X is a strong electron withdrawing group and a is a whole number preferably equal to 1 or 2.*

*22. The process of claim 21 where the $pK_a$ varies between −5 and −15.*

*23. The process of claim 21 where the strong electron withdrawing group is selected from the group consisting of halo, nitro, cyano.*

*24. The process of claim 23 where the strong electron withdrawing group is perfluoroalkyl having from 1 to 18 carbon atoms.*

*25. The process of claim 24 where the strong electron withdrawing group is trifluoromethyl.*

*26. The process of claim 16 where the acid labile blocking group requires an activation energy of from 25 to 40 Kcal/mol for deblocking.*

*27. The process of claim 16 where the acid is selected from the group consisting of perfluorooctane sulfonic acid and 2-trifluoromethylbenzene sulfonic acid.*

*28. The process of claim 16 where the photoresist contains a base having a $pK_a$ of at least 9.*

*29. The process of claim 28 where the $pK_a$ varies between 11 and 15.*

*30. The process of claim 28 where the base conforms to the formula $N(R')A_4$ where R' is substituted or unsubstituted alkyl preferably having from 1 to about 12 carbon atoms or substituted or unsubstituted aryl, A is a counter anion of a member selected from the group consisting of halide, a substituted or unsubstituted hydroxyalkanoyl having from 1 to 18 carbon atoms and substituted or unsubstituted sulfonate.*

*31. The process of claim 30 where the counter anion is sulfonate.*

*32. The process of claim 16 where the photoresist is exposed to radiation having a wavelength of about 248 nm.*

* * * * *